United States Patent
Hu et al.

(10) Patent No.: US 7,579,686 B2
(45) Date of Patent: Aug. 25, 2009

(54) THERMAL INTERFACE MATERIAL WITH HOTSPOT HEAT REMOVER

(75) Inventors: Xuejiao Hu, Phoenix, AZ (US); Chia-Pin Chiu, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 89 days.

(21) Appl. No.: 11/618,593

(22) Filed: Dec. 29, 2006

(65) Prior Publication Data

US 2008/0157348 A1 Jul. 3, 2008

(51) Int. Cl.
*H01L 23/10* (2006.01)
*H01L 23/34* (2006.01)

(52) U.S. Cl. ............... 257/706; 257/720; 257/E23.101

(58) Field of Classification Search .............. 257/706, 257/707, 720, 722, E23.051, E23.101, E23.102, 257/E23.106, 713
See application file for complete search history.

(56) References Cited

U.S. PATENT DOCUMENTS

| | | | | |
|---|---|---|---|---|
| 6,081,027 A * | 6/2000 | Akram | ...................... | 257/707 |
| 6,580,611 B1 | 6/2003 | Vandentop et al. | .......... | 361/704 |
| 7,199,466 B2 | 4/2007 | Chiu | ......................... | 257/707 |
| 7,259,965 B2 | 8/2007 | Chang et al. | ................. | 361/699 |
| 7,416,922 B2 * | 8/2008 | Houle et al. | ................ | 438/122 |
| 2004/0118501 A1 | 6/2004 | Chiu et al. | .................... | 156/64 |
| 2004/0188814 A1 | 9/2004 | Houle et al. | ................ | 257/678 |
| 2004/0241417 A1 * | 12/2004 | Fischer et al. | ............ | 428/317.9 |
| 2005/0285261 A1 | 12/2005 | Prasher et al. | .............. | 257/718 |
| 2006/0289987 A1 | 12/2006 | Chiu | .......................... | 257/714 |
| 2007/0090517 A1 | 4/2007 | Moon et al. | ................. | 257/706 |
| 2008/0150112 A1 | 6/2008 | Hu | .............................. | 257/686 |

* cited by examiner

*Primary Examiner*—Sue Purvis
*Assistant Examiner*—Selim Ahmed
(74) *Attorney, Agent, or Firm*—Konrad Raynes + Victor, LLP; Alan S. Raynes

(57) ABSTRACT

The formation of electronic assemblies including a heat spreader coupled to a die through a thermal interface material is described. In one embodiment, the heat spreader includes a surface having a structure extending a distance outward therefrom. The thermal interface material includes a first region having a first thickness and a second region having a second thickness, the first thickness being smaller than the second thickness. The structure extending a distance outward from the heat spreader is positioned on the first region of the thermal interface material. The total of the first thickness of the thermal interface material and the distance the structure extends outward from the surface of the heat spreader is substantially the same as the second thickness. In one aspect of certain embodiments, the first region of the thermal interface material and the structure on the heat spreader are in alignment with a hot spot on the die. Other embodiments are described and claimed.

20 Claims, 2 Drawing Sheets

THERMAL INTERFACE MATERIAL WITH HOTSPOT HEAT REMOVER

RELATED ART

Integrated circuits may be formed on semiconductor wafers that are formed from materials such as silicon. The semiconductor wafers are processed to form various electronic devices thereon. The wafers are diced into semiconductor chips, which may then be attached to a package substrate using a variety of known methods. In one known method for attaching a chip (also known as a die) to a substrate, the die may have solder bump contacts that are electrically coupled to the integrated circuit. The solder bump contacts extend onto the contact pads of a package substrate, and are typically attached in a thermal reflow process. Electronic signals may be provided through the solder bump contacts to and from the integrated circuit.

Operation of the integrated circuit generates heat in the device. As the internal circuitry operates at increased clock frequencies and/or higher power levels, the amount of heat generated may rise to levels that are unacceptable unless some of the heat can be removed from the device. Heat is conducted to a surface of the die, and should be conducted or convected away to maintain the temperature of the integrated circuit below a predetermined level for purposes of maintaining functional integrity of the integrated circuit.

One way to conduct heat from an integrated circuit die is through the use of a heat spreader, which is a body positioned to transmit heat away from a die. FIG. 1 illustrates a conventional electronic assembly, including a heat spreader 12 positioned on a die 14 and thermally coupled to the die 14 through a thermal interface material (TIM) 16. Materials such as solders and polymers may be used as thermal interface materials. Thermal interface materials formed from solders generally have a higher heat conductivity and thus have an advantage in thermal performance when compared with thermal interface materials comprising polymers. However, thermal interface materials comprising polymers often have advantages such as greater flexibility, lower stresses, and lower cost.

BRIEF DESCRIPTION OF THE DRAWINGS

Embodiments are described by way of example, with reference to the accompanying drawings, which are not drawn to scale, wherein.

DETAILED DESCRIPTION

Certain embodiments relate to electronic assemblies including the use of a thermal interface material and a structure to enhance heat removal in hot spot regions on a die.

Figure 1:
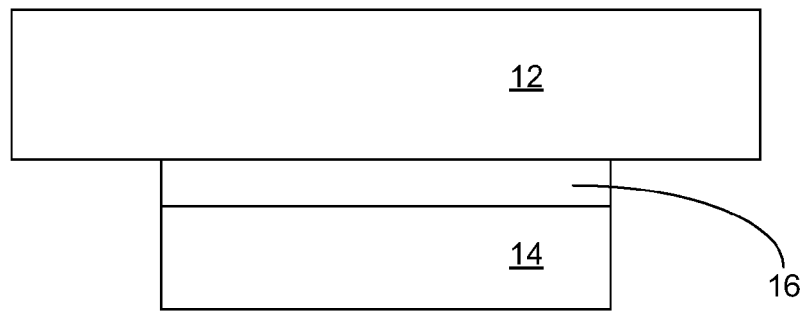
FIG. 1 illustrates a conventional electronic assembly including a heat spreader coupled to a die through a thermal interface material.
Figure 2:
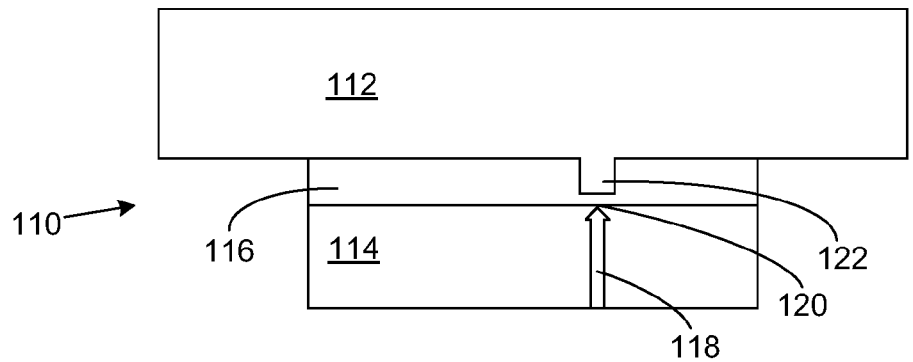
FIG. 2 illustrates an electronic assembly including a heat spreader coupled to a die through a thermal interface material, including the presence of a hotspot heat remover structure, in accordance with certain embodiments.

FIG. 2 illustrates an embodiment of an electronic assembly 110 including a thermal interface material 116 positioned between a die 114 and a heat spreader 112. The die 114 includes one or more hot spots 120 on the surface facing the thermal interface material 116. A hot spot 120 is generated from heat that accumulates in the die 114 in a manner so that heat is transmitted through at least part of the die, as indicated by arrow 118 extending through the die 114 and pointing to the hot spot 120. The assembly 110 also includes a structure 122 positioned in alignment with the hot spot 120. By aligned it is meant that at least part of the structure 122 is positioned over the hot spot 120. If the assembly were flipped, with the die on top and the heat spreader on the bottom, then at least part of the structure would be positioned under the hot spot. Where multiple hot spots 120 are present, multiple structures 122 may be used.

The structure 122 may be formed integral to the heat spreader 112 or may be formed as a separate component that is coupled to the heat spreader 112. In general, better thermal conductivity will be achieved if the structure 122 is formed as part of the heat spreader 112. This may be accomplished in a number of suitable ways. For example, the heat spreader 112 may be formed from a metal and be punched or stamped to have a geometry that includes the structure 122 integral thereto. Alternatively, the heat spreader 112 could be machined to include the structure 122 thereon. Other suitable fabrication methods could also be used.

Figure 3:
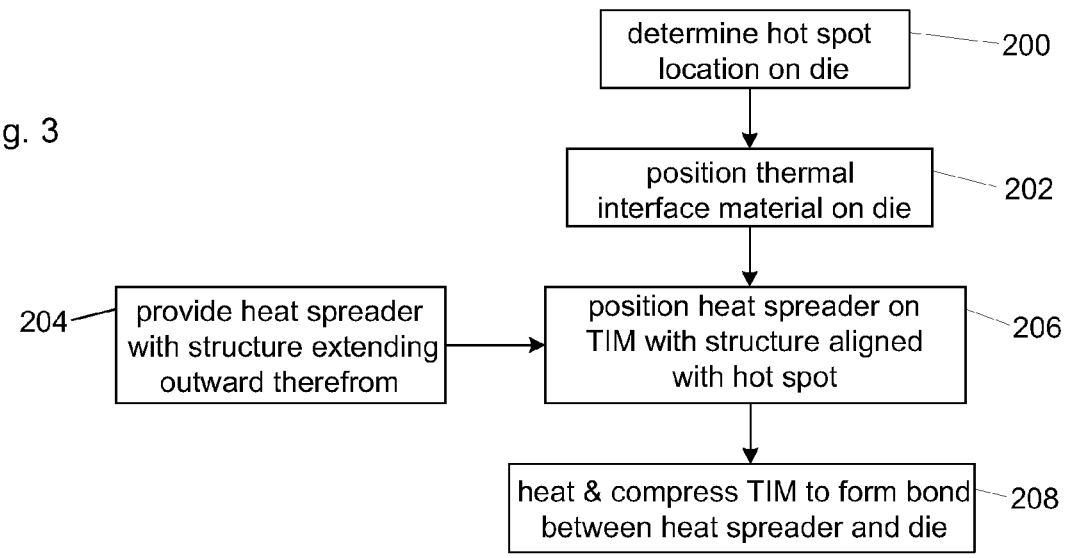
FIG. 3 illustrates a flow chart including operations for forming an electronic assembly, in accordance with certain embodiments.

FIG. 3 is a flow chart showing a number of operations in accordance with certain embodiments for forming an electronic assembly including a hot spot heat remover. Box 200 is determining a hot spot location for a die. This may be accomplished using any suitable method. For example, one method for determining hot spot locations on a die is to measure the temperature at different locations on the surface of a similar die during operation. Methods utilizing computer simulation may also be used determine the location of hot spots on the die surface. In addition to measurement and computer simulation, the hot spots may also be determined by the layout of the die architecture. For example, a floating point register may generate more heat and form a hot spot on the die.

Box 202 is positioning a thermal interface material on the die. Box 204 is providing a heat spreader with a structure extending outward therefrom. The structure may in certain embodiments be integral to the heat spreader. The structure will act as a hot spot heat remover in the finished assembly. Box 206 is positioning the heat spreader on the thermal interface material, with the structure aligned with the hot spot on the die. There may be more than one hot spot on a die, with a different structure positioned on each hot spot if desired. Box 208 is heating and compressing the thermal interface material to form a bond between the die and the heat spreader, and thus form a bonded assembly. Depending on the type of thermal interface material used, the heating may include, for example, reflowing a solder or curing a polymer thermal interface material. Various modifications to the method described in the flowchart may be made. For example, in certain alternative embodiments, the thermal interface material may be first placed on the heat spreader, and then the die may be positioned so that the thermal interface material is positioned between the heat spreader and die.

At the location of the hot spot heat remover structure, the thickness of the thermal interface material (known as the bond-line thickness BLT), will be substantially smaller than in locations adjacent to the hot spot heat remover structure. As seen in the embodiment illustrated in FIG. 2, for example, the structure 122 extends downward from the surface of the heat spreader 112. When compared to the bond-line thickness in locations where there is no structure 122, the bond-line thickness of the thermal interface material 116 is substantially smaller between the structure 122 and the die hot spot 120. This permits improved thermal performance in removing heat from the die hot spot 120, because the thermal resistance in the thermal interface is proportional to the bond line thickness (BLT) divided by the thermal conductivity of the thermal interface material ($k_{TIM}$). As a result, making the thermal interface material thinner over the hot spot, and providing a structure having a higher thermal conductivity over the thinner thermal interface material, results in better thermal performance of the assembly. Thus, in the embodiment illustrated in FIG. 2, the thermal interface material has a thin bond-line thickness on the hot spot 120, and a thicker bond-line thickness at other locations. The thicker bond-line thickness may be necessary to provide adequate cushion for any thermal expansion mismatch that might damage the assembly if the thermal interface material 116 was too thin. As seen in FIG. 2, the thickness of the thermal interface material 116 on the hot spot 120 plus the thickness of the structure 122 is substantially the same as the thickness of the thermal interface material 116 adjacent to sides of the structure 122 and the hot spot 120.

In certain embodiments, the heat spreader and hot spot heat remover structure may be made from a variety of high thermal conductivity materials, including, but not limited to, metals such as aluminum, copper, and silver, ceramics such as aluminum oxide and aluminum nitride, composites such as aluminum/silicon carbide, and other materials such as silicon and diamond. The heat spreader should generally have a thermal conductivity that is higher than that of the thermal interface material in order to ensure suitable heat transfer. The thermal interface material may be formed from a variety of materials, including solders and polymers. Examples of polymer thermal interface materials include, but are not limited to, epoxy, adhesive, thermal grease, silicon-based polymers, and phase change materials. Such polymers may contain thermally conductive particles therein. Thermally conductive particles include, but are not limited to, metal particles such as silver, and ceramic particles such as aluminum oxide, zinc oxide, and aluminum nitride. It may be useful in certain embodiments to use thermally conductive particles having a mean particle size of about 1 micron or smaller, even down to nanoscale size (on the order of a nanometer).

Examples of thicknesses of various layers in an electronic assembly in accordance with certain embodiments will be discussed in connection with FIG. 2. The thermal interface material 116 bond-line thickness on the hot spot 120 (and under the structure 122) may in certain embodiments be no greater than 10 microns. In other embodiments the thermal interface material 116 bond-line thickness on the hot spot 120 (and under the structure 122) is no greater than 5 microns. In addition, in certain embodiments, the thermal interface material 116 bond-line thickness to the sides of the structure 122 is at least 15 microns. In other embodiments, the thermal interface material 116 bond-line thickness to the sides of the structure 122 is in the range of 15-30 microns. In one embodiment, the thermal interface material 116 bond-line thickness on the hot spot 120 (and under the structure 122) is no greater than 5 microns and the thermal interface material 116 bond-line thickness to the sides of the structure 122 is no less than 20 microns.

The structure 122 may in certain embodiments extend outward from the rest of the surface of the heat spreader 112 a distance of 10-25 microns. Certain more specific embodiments include the structure extending outward from the rest of the surface of the heat spreader 112 a distance of 15-20 microns.

Figure 4:
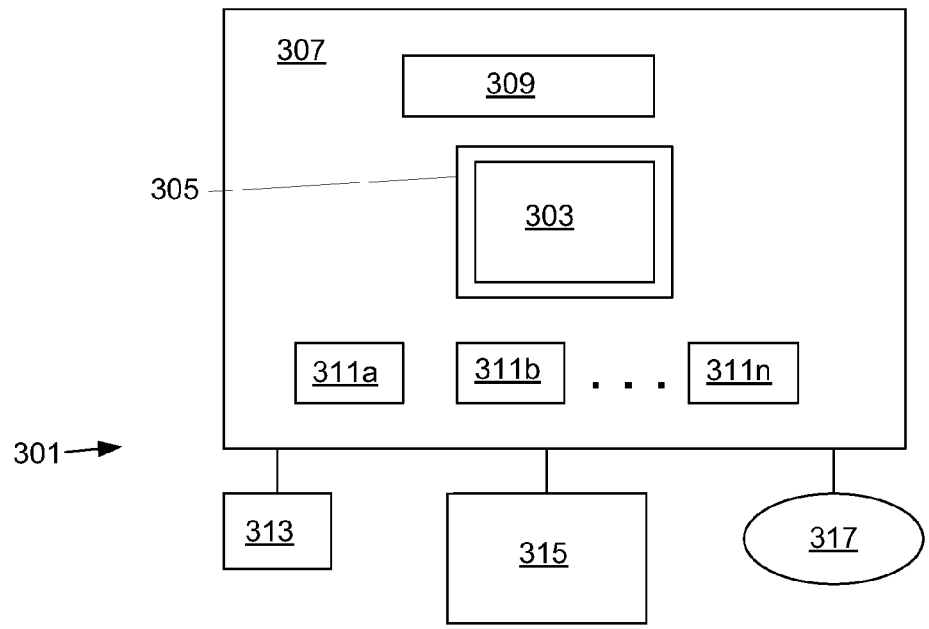
FIG. 4 illustrates an electronic system arrangement in which certain embodiments may find application.

Assemblies as described in embodiments above may find application in a variety of electronic components. FIG. 4 schematically illustrates one example of an electronic system environment in which aspects of described embodiments may be embodied. Other embodiments need not include all of the features specified in FIG. 4, and may include alternative features not specified in FIG. 4.

The system 301 of FIG. 4 may include at least one central processing unit (CPU) 303. The CPU 303, also referred to as a microprocessor, may be a chip that is attached to an integrated circuit package substrate 305, which is then coupled to a printed circuit board 307, which in this embodiment, may be a motherboard. The CPU 303 on the package substrate 305 is an example of an electronic device assembly that may have a structure formed in accordance with embodiments such as described above and illustrated in FIGS. 2-3. A variety of other system components, including, but not limited to memory and other components discussed below, may also include assembly structures formed in accordance with the embodiments described above.

The system 301 further may further include memory 309 and one or more controllers 311a, 311b . . . 311n, which are also disposed on the motherboard 307. The motherboard 307 may be a single layer or multi-layered board that has a plurality of conductive lines that provide communication between the circuits in the package 305 and other components mounted to the board 307. Alternatively, one or more of the CPU 303, memory 309 and controllers 311a, 311b . . . 311n may be disposed on other cards such as daughter cards or expansion cards. The CPU 303, memory 309 and controllers 311a, 311b . . . 311n may each be seated in individual sockets or may be connected directly to a printed circuit board. A display 315 may also be included.

Any suitable operating system and various applications execute on the CPU 303 and reside in the memory 309. The content residing in memory 309 may be cached in accordance with known caching techniques. Programs and data in memory 309 may be swapped into storage 313 as part of memory management operations. The system 301 may comprise any suitable computing device, including, but not limited to, a mainframe, server, personal computer, workstation, laptop, handheld computer, handheld gaming device, handheld entertainment device (for example, MP3 (moving picture experts group layer—3 audio) player), PDA (personal digital assistant) telephony device (wireless or wired), network appliance, virtualization device, storage controller, network controller, router, etc.

The controllers 311a, 311b . . . 311n may include one or more of a system controller, peripheral controller, memory controller, hub controller, I/O (input/output) bus controller, video controller, network controller, storage controller, communications controller, etc. For example, a storage controller can control the reading of data from and the writing of data to the storage 313 in accordance with a storage protocol layer. The storage protocol of the layer may be any of a number of known storage protocols. Data being written to or read from the storage 313 may be cached in accordance with known caching techniques. A network controller can include one or more protocol layers to send and receive network packets to and from remote devices over a network 317. The network 317 may comprise a Local Area Network (LAN), the Internet, a Wide Area Network (WAN), Storage Area Network (SAN), etc. Embodiments may be configured to transmit and receive data over a wireless network or connection. In certain embodiments, the network controller and various protocol layers may employ the Ethernet protocol over unshielded twisted pair cable, token ring protocol, Fibre Channel protocol, etc., or any other suitable network communication protocol.

While certain exemplary embodiments have been described above and shown in the accompanying drawings, it is to be understood that such embodiments are merely illustrative and not restrictive, and that embodiments are not restricted to the specific constructions and arrangements shown and described since modifications may occur to those having ordinary skill in the art.

What is claimed:

1. An electronic assembly comprising:
   a heat spreader;
   a die;
   a thermal interface material positioned between the thermally conductive heat spreader and the die;
   the heat spreader including a surface facing the thermal interface material;
   the die including a surface facing the thermal interface material;
   the die surface including a first hot spot, the first hot spot comprising a location on the die surface having a higher surface temperature during operation than another location on the die surface;
   the heat spreader surface including a first structure thereon, the structure being positioned in alignment with the first hot spot;
   wherein the thermal interface material has a first thickness between the surface of the die at the hot spot and the structure on the heat spreader surface;
   wherein the thermal interface material has a second thickness between the surface of the die adjacent to the hot spot and a position adjacent to the structure on the surface of the heat spreader; and
   wherein the first thickness is smaller than the second thickness.

2. The electronic assembly of claim 1, wherein the structure is integral to the heat spreader.

3. The electronic assembly of claim 1, wherein the heat spreader and the structure each comprise a metal.

4. The electronic assembly of claim 1, wherein the heat spreader and the structure are formed from the same material.

5. The electronic assembly of claim 1, wherein the heat spreader and the structure each comprise copper.

6. The electronic assembly of claim 1, wherein the structure extends outward from the surface of the heat spreader a distance in the range of 10-25 microns.

7. The electronic assembly of claim 1, wherein the structure extends outward from the surface of the heat spreader a distance in the range of 15-20 microns.

8. The electronic assembly of claim 1, wherein the thermal interface material comprises a polymer.

9. The electronic assembly of claim 1, wherein the thermal interface material includes a polymer and thermally conducting particles selected from at least one of the group consisting of metals and ceramics.

10. The electronic assembly of claim 1, wherein the thermal interface material first thickness is no greater than 10 microns.

11. The electronic assembly of claim 1, wherein the thermal interface material second thickness is 15-30 microns, and the thermal interface material first thickness is no greater than 5 microns.

12. An electronic assembly comprising:
    a die;
    a heat spreader including a surface having a structure extending a distance outward therefrom;
    a thermal interface material comprising a material having a lower thermal conductivity than that of the heat spreader, the thermal interface material positioned between the die and the surface of the heat spreader;
    the thermal interface material including a first region having a first thickness and a second region having a second thickness, the first thickness being smaller than the second thickness;
    the structure being positioned on the first region of the thermal interface material;
    wherein the total of the first thickness of the thermal interface material and the distance the structure extends outward from the surface of the heat spreader is substantially the same as the second thickness; and
    wherein the die includes at least one hot spot comprising a position on the die that is at a higher temperature during operation than another position on the die, and wherein the first region of the thermal interface material and the structure on the heat spreader are in alignment with a hot spot on the die.

13. The electronic assembly of claim 12, wherein the first thickness of the thermal interface material is no greater than one fourth the thickness of the second thickness of the thermal interface material.

14. The electronic assembly of claim 12, wherein the first thickness is no greater than 5 microns, and the second thickness is at least 20 microns.

15. An electronic assembly comprising:
    a die;
    a heat spreader including a surface having a structure extending a distance outward therefrom;
    a thermal interface material positioned between the die and the surface of the heat spreader;
    the thermal interface material including a first region having a first thickness and a second region having a second thickness, the first thickness being smaller than the second thickness;
    the structure being positioned on the first region of the thermal interface material;
    wherein the total of the first thickness of the thermal interface material and the distance the structure extends outward from the surface of the heat spreader is substantially the same as the second thickness;
    wherein the thermal interface material comprises a polymer; and
    wherein the die includes at least one hot spot comprising a position on the die that is at a higher temperature during operation than another position on the die, and wherein the first region of the thermal interface material and the structure on the heat spreader are in alignment with a hot spot on the die.

16. A method for forming an electronic assembly, comprising:
    determining the location of a first hot spot on a die surface, the hot spot comprising a position on the die surface having a higher temperature during operation than another location on the die surface;
    positioning a thermal interface material on the die surface; and
    positioning a heat spreader having a first structure thereon on the thermal interface material so that the thermal interface material is between the die and the heat spreader and so that the first structure is positioned is positioned in alignment with the first hot spot;
    wherein the thermal interface material is positioned to include a first thickness between the surface of the die at the hot spot and the first structure on the heat spreader, and a second thickness between the surface of the die adjacent to the hot spot and a position adjacent to the first structure on the heat spreader, wherein the first thickness is smaller than the second thickness.

17. The method of claim 15, further comprising positioning the first structure within 5 microns of the die surface.

18. The method of claim 16, further comprising forming the assembly so that the first thickness of the thermal interface material is no greater than 5 microns thick and the second thickness of the thermal interface material is at least 15 microns thick.

19. The method of claim 16 further comprising forming the thermal interface material from a material comprising a polymer.

20. The electronic assembly of claim 12, wherein the thermally conductive material comprises a polymer and thermally conductive particles.

* * * * *

UNITED STATES PATENT AND TRADEMARK OFFICE
CERTIFICATE OF CORRECTION

PATENT NO. : 7,579,686 B2  Page 1 of 1
APPLICATION NO. : 11/618593
DATED : August 25, 2009
INVENTOR(S) : Hu et al.

It is certified that error appears in the above-identified patent and that said Letters Patent is hereby corrected as shown below:

In the Claims:

Column 6, lines 61-62, Claim 16, "is positioned is positioned in" should read --is positioned in--.

Signed and Sealed this
Twenty-eighth Day of July, 2015

Michelle K. Lee
*Director of the United States Patent and Trademark Office*